United States Patent
Reinmuth

(10) Patent No.: US 8,436,434 B2
(45) Date of Patent: May 7, 2013

(54) MICROMECHANICAL COMPONENT

(75) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/298,753

(22) Filed: Nov. 17, 2011

(65) Prior Publication Data
US 2012/0133003 A1 May 31, 2012

(30) Foreign Application Priority Data

Nov. 26, 2010 (DE) .......................... 10 2010 062 056

(51) Int. Cl.
*H01L 29/84* (2006.01)
*G01P 15/125* (2006.01)

(52) U.S. Cl.
USPC .................. 257/415; 73/514.24; 73/514.32

(58) Field of Classification Search .......................... None
See application file for complete search history.

(56) References Cited

U.S. PATENT DOCUMENTS

| | | | | |
|---|---|---|---|---|
| 5,447,067 A * | 9/1995 | Biebl et al. | .................. | 73/514.32 |
| 5,504,356 A * | 4/1996 | Takeuchi et al. | ............... | 257/254 |
| 5,576,250 A * | 11/1996 | Diem et al. | .................... | 438/50 |
| 5,614,742 A * | 3/1997 | Gessner et al. | ................ | 257/254 |
| 5,659,195 A * | 8/1997 | Kaiser et al. | ................... | 257/415 |
| 5,780,885 A * | 7/1998 | Diem et al. | ..................... | 257/254 |
| 6,104,073 A * | 8/2000 | Ferrari et al. | ................. | 257/417 |
| 6,184,051 B1 * | 2/2001 | Ferrari et al. | ..................... | 438/48 |
| 6,739,189 B2 * | 5/2004 | Lee et al. | ......................... | 73/488 |
| 7,402,449 B2 * | 7/2008 | Fukuda et al. | .................. | 438/53 |
| 7,851,876 B2 * | 12/2010 | Ramamoorthi et al. | ...... | 257/419 |
| 7,878,061 B2 * | 2/2011 | Classen et al. | ............. | 73/514.38 |

FOREIGN PATENT DOCUMENTS

| | | |
|---|---|---|
| DE | 10 2008 043 524 | 5/2010 |
| DE | 10 2008 043 788 | 5/2010 |

* cited by examiner

*Primary Examiner* — Evan Pert
(74) *Attorney, Agent, or Firm* — Kenyon & Kenyon LLP

(57) ABSTRACT

A micromechanical component includes: a substrate having a multitude of trench structures which separate a first and a second mass element of the substrate from a web element of the substrate, in such a way that the first and second mass elements enclose the web element along an extension direction of the main surface of the substrate and are disposed to allow movement relative to the substrate in the direction of a surface normal of the main surface; a first electrode layer applied on the main surface of the substrate and forms a first electrode on the web element between the first and second mass elements; and a second electrode layer applied on the first and second mass elements and forming a self-supporting second electrode above the first electrode in the area of the web element, the first and second electrode forming a capacitance.

5 Claims, 1 Drawing Sheet

US 8,436,434 B2

MICROMECHANICAL COMPONENT

BACKGROUND OF THE INVENTION

1. Field of the Invention

The present invention relates to a micromechanical component, which is formed within a substrate of an integrated circuit.

2. Description of Related Art

Miniaturized sensors currently play an important role in metrology. Micro-electromechanical systems (MEMS) are frequently used as first sensors for measured physical quantities. Acceleration sensors or magnetic field sensors, in particular, are realizable in the form of integrated circuits in micro system technology.

Known acceleration sensors are predominantly based on spring-mass systems, in which small silicon arms whose mass is likewise produced from silicon serve as springs. A deflection during an acceleration causes a change in capacitance between the silicon arms and a reference electrode; the change constitutes a measure for the acceleration and is able to be measured and converted via evaluation electronics in an integrated circuit.

Photolithographic methods and/or wet or dry etching methods are usually employed in the production of acceleration sensors for the purpose of forming the spring-mass systems in a silicon substrate.

From the published German patent application document DE 10 2008 043 524 A1, for example, an acceleration sensor is known, which has a reference electrode structure on a base substrate and a movable sensor element having an electrode area, a change in capacitance coming about between the reference electrode structure and the electrode area of the sensor element in response to a deflection of the sensor element by the action of an acceleration.

Also described in published German patent application document DE 10 2008 043 788 A1 is a micro-electromechanical component which has at least one stator electrode fixedly disposed on a substrate, as well as a rotating mass, disposed at a distance thereto in rotatable manner, in the form of an asymmetrical balancing rocker, which is structured out of a semiconductor layer applied on the substrate and developed as at least one actuator electrode.

BRIEF SUMMARY OF THE INVENTION

One idea of the present invention consists of providing a micromechanical component, which is able to be manufactured in an uncomplicated, cost-effective and space-saving manner in CMOS technology, and which has high measuring precision.

According to one specific development, a micromechanical component includes a substrate having a main surface, and a first multitude of trenches in the substrate, which trenches separate a first and a second mass element of the substrate from a first web element of the substrate, in such a way that the first and the second mass elements enclose the first web element along an extension direction of the main surface and are disposed in a manner allowing movement relative to the substrate in the direction of a surface normal of the main surface; it also includes a first electrode layer which is applied on the main surface of the substrate and forms a first electrode on the first web element between the first and the second mass element; and a second electrode layer, which is applied on the first and the second mass element and forms a self-supporting second electrode above the first electrode in the region of the first web element, the first and second electrodes forming a first capacitance. This system offers the advantage that an acceleration sensor for a direction perpendicular to the main surface is able to be developed within a substrate, which sensor is developed completely in CMOS technology.

The micromechanical component preferably also includes a second multitude of trenches in the substrate, which trenches separate a third and a fourth mass element of the substrate from a second web element of the substrate, in such a way that the third and the fourth mass elements enclose the second web element along an extension direction of the main surface and are disposed so as to allow movement in relation to the substrate in the direction of a surface normal of the main surface, the first electrode layer forming a third electrode on the second web element between the third and the fourth mass element, and the second electrode layer being applied on the third and the fourth mass element and forming a self-supporting fourth electrode above the third electrode in the region of the second web element, the third and the fourth electrodes forming a second capacitance. This makes it possible to produce a capacitance rocker arm, in particular.

If the mass of the third and fourth mass elements is greater than the mass of the first and second mass elements, it is furthermore advantageously possible to create a mass asymmetry, by which an acceleration along the surface normal of the main surface is measurable via a difference of the capacitance changes of the first and the second capacitance. It is especially advantageous that the self-supporting second and fourth electrodes as movable electrodes are not loaded by substrate material, which therefore makes it possible to realize a mass asymmetry in the capacitance rocker arm in a less complicated manner and in a smaller space.

The above developments and further refinements may be combined as desired if such a combination is useful. Additional possible developments, further refinements and implementations of the present invention also include combinations of features of the present invention not explicitly mentioned with regard to the exemplary embodiments described previously and in the following text.

DETAILED DESCRIPTION OF THE INVENTION

Figure 1:
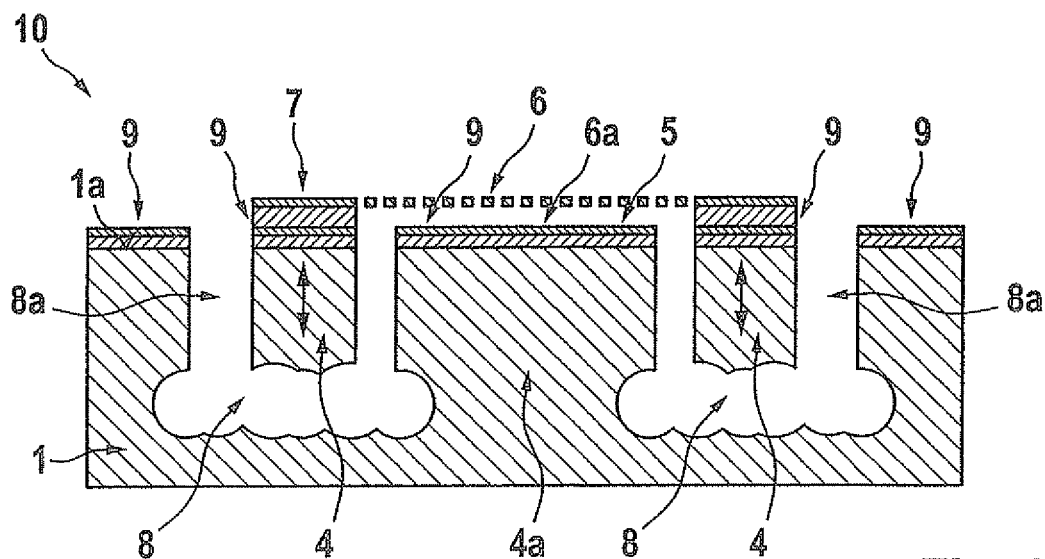
FIG. 1 shows an acceleration sensor in a cross-sectional view according to one specific development of the present invention.

Unless stated otherwise, identical or functionally equivalent elements, features and components have been provided with the same reference numerals. It is understood that components and elements in the figures are not necessarily depicted to scale for reasons of clarity and comprehensibility.

FIG. 1 shows an acceleration sensor 10 in a cross-sectional view according to one specific embodiment of the present invention. Acceleration sensor 10 includes a substrate 1 having a main surface 1a. Substrate 1 may be a silicon substrate, for example. A multitude of trenches 8a has been introduced in substrate 1, which trenches physically separate mass elements 4 from a web element 4a within substrate 1. Trenches 8a are connected via cavities 8 within substrate 1, so that mass elements 4, as indicated by the arrows, are disposed in a manner allowing movement in the direction of a surface normal of main surface 1a of substrate 1. Trenches 8a have a typical width of approximately 0.5 to 5 μm. Typical dimensions of the cavities are 1-10 μm. Trenches 8a are introducible in substrate 1 with the aid of a directional/isotropic plasma etching process. Cavities 8 are able to be introduced, for example, via a non-directional/isotropic etching process at low gas pressure. Prior to the etching process, the perpendicular side walls of the trenches may be passivized, so that the isotropic etch attack starts only at the base surfaces of the trenches. This may be done, for instance, by a conformal oxide deposition on the entire surface and subsequent directional oxide etching (RIE "reactive ion etching"), during which only the oxide on the horizontal surfaces is opened. It is important in this context that mass elements 4 are exposed through cavities 8 in a manner that allows them to move. This advantageously requires mass elements 4 to be sufficiently narrow, so that the isotropic etching process is able to form cavities at the base of trenches 8a, these cavities being able to abut each other during the etching process and forming a common cavity 8 underneath individual mass element 4.

Applied on main surface 1a of substrate 1 on web element 4a is a first electrode layer 9, which forms a first electrode 6a in the region of web element 4a. First electrode layer 9 preferably is a metal layer. First electrode layer 9 may also extend across additional areas of main surface 1a of substrate 1, such as across mass elements 4 or areas outside of mass elements 4 and of web element 4a. In these areas the metal layer is usable as etching mask for the production of trenches 8a. In addition, this layer may be used to produce CMOS switch elements or also as protective layer for CMOS switch elements, which protects possibly already existing CMOS elements while the special MEMS elements are produced. The same applies to the additional metal layers.

One or a plurality of dielectric layer(s), in particular oxide layers, may be deposited on main surface 1a of substrate 1a underneath first electrode layer 9. The dielectric layers are also usable as masking layers for the etching processes of trenches 8a and/or cavities 8.

A second electrode layer 7 is deposited on mass elements 4. One or more dielectric layer(s) may be situated between main surface 1a of substrate 1 and second electrode layer 7 in the region of mass elements 4. In the same way, additional metal layers may be situated underneath second electrode layer 7. The metal layers may be separated by additional dielectric layers, and contact regions may be provided between the metal layers. It is possible that the electrode layer is perforated and spans first electrode layer 9 in the region of web element 4a. The dielectric layers between second electrode layer 7 and first electrode layer 9 in the region of web elements 4a may also be removed. The basic clearance between electrodes is able to be adjusted in a defined manner through the selection of the dielectric layers between the two electrode layers 7 and 9.

A CVD process, for example, can be used to apply the dielectric layers on mass elements 4, substrate 1 and/or web element 4a.

Placing first electrode 6a and second electrode 6 on top of one another forms a capacitance 5. The value of capacitance 5 depends on the distance between first electrode 6a and second electrode 6, among other things. This distance may vary since mass elements 4 are designed to be able to move relative to substrate 1 and thus, in particular, relative to web element 4a, in the direction of the surface normal of the main surface. For example, if an acceleration is acting on acceleration sensor 10, then mass elements 4 are deflected relative to substrate 1, and the distance between first electrode 6a and second electrode 6 changes. This leads to a change in capacitance 5.

Figure 2:
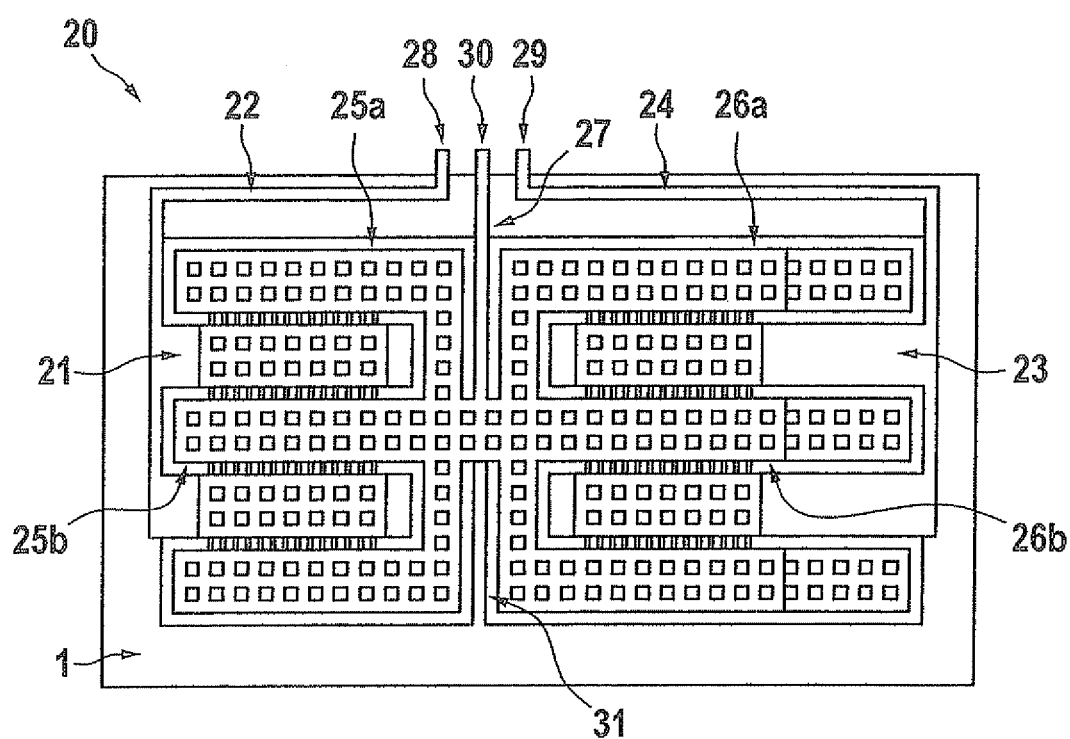
FIG. 2 shows the acceleration sensor from FIG. 1 in a plan view.

FIG. 2 shows an acceleration sensor 20 in a plan view according to another specific development of the present invention. Acceleration sensor 20 may be similar to acceleration sensor 10, in particular. Acceleration sensor 20 includes a substrate 1 in which a multitude of trenches has been introduced, the trenches being similar to trenches 8a in FIG. 1. A first electrode layer covers a first web element 21, which may correspond to web element 4a in FIG. 1. First web element 21 is situated in an extension direction of the main surface of substrate 1, between two first mass elements 25a and 25b, which are separated from first web element 21 by trenches. Not visible in FIG. 2 are cavities, similar to cavities 8 in FIG. 1, which extend underneath first mass elements 25a and 25b and which allow first mass elements 25a and 25b to move relative to the substrate in the direction of a normal to the drawing plane. First mass elements 25a and 25b may remain connected to the rest of the substrate via a center web 31.

FIG. 2, by way of example, shows three first mass elements on the left side of center web 31, which enclose two first web elements in the manner of a comb. Like the first web elements, the first mass elements continue to be shown in rectangular form by way of example. It is understood, of course, that any other number of first mass elements and first web elements and any other form are possible for the mass and web elements for the realization of the acceleration sensor according to the present invention. A typical dimension of the first mass elements is approximately 5 to 50 μm in length and approximately 0.5 to 5 μm in width. The first web elements may be dimensioned accordingly. However, it should be clear that other dimensions are also selectable for the mass and web elements.

First web element 21 is coated with a first electrode layer, which may be similar to first electrode layer 9 in FIG. 1. It may be provided that the first electrode layer is connected via lines 22 to a first electrode terminal 28 in an edge region of substrate 1.

First mass elements 25a and 25b are coated with a second electrode layer, which may be similar to second electrode layer 7 in FIG. 1. It may be provided that the second electrode layer is connected via center web 31, for example, to a line 27, which allows for the connection of the second electrode layer via a second electrode terminal 30 in the edge region of substrate 1.

The second electrode layer is developed in such a way that it extends in self-supporting manner in a region above first web element 21, between first mass elements 25a and 25b. Toward this end, a region of the second electrode layer above the first electrode layer is connected via thin webs to the regions of the second electrode layer above first mass elements 25a and 25b and forms a second electrode 6 above an area of the first electrode layer, which area forms a first electrode 6a. First electrode 6a and second electrode 6 form a capacitance, in a manner similar to capacitance 5 in FIG. 1. Via electrode terminals 28 and 30 a voltage may be applied to first electrode 6a and second electrode 6 in order to measure the capacitance.

The second electrode layer may preferably be perforated so as to introduce trenches into the substrate via the perforation holes, with the aid of anisotropic etching processes. This in turn facilitates the underetching of mass elements 25a and 25b by isotropic etching processes at the base of the trenches introduced into the perforation holes. The perforation is also advantageous for the selective removal of the dielectric layers between the first and second electrode layer in the region of web elements 4a, for which an isotropic etching process is employed. In addition, it is advantageous to keep the webs that connect second electrode 6 to the second electrode layer above first mass elements 25a and 25b as narrow as possible in order to ensure complete underetching and thus complete separation of first mass elements 25a and 25b from first web elements 21 in the separation trenches.

According to one further specific development, second mass elements 26a and 26b as well as a second web element 23 may be designed to include a further multitude of trenches and cavities within the substrate. Second mass elements 26a and 26b and second web element 23 are developed in a similar way as first mass elements 25a and 25b as well as first web element 21. The difference consists of the fact that second mass elements 26a and 26b have more mass than first mass elements 25a and 25b, due to a greater length in substrate 1 as shown in FIG. 2, for example. However, there are many other ways of providing second mass elements 26a and 26b with greater mass than first mass elements 25a and 25b.

A similar method as described above may be used for applying the first and second electrode layers on second mass elements 26a and 26b as well as second web element 23. This provides a third and fourth electrode, which form a second capacitance. A voltage may be applied to the second capacitance via electrode terminals 29 and 30 and via lines 24 and 27 in order to measure the second capacitance. The second capacitance may have similar geometrical dimensions as the first capacitance.

As shown in FIG. 2 by way of example, the two mass elements 26a and 26b may be connected to the substrate via center web 31, just like first mass elements 25a and 25b. This makes it possible to produce a capacitance rocker arm with first mass elements 25a and 25b on the one side, and second mass elements 26a and 26b on the other side. However, it is also possible to place first mass elements 25a and 25b and second mass elements 26a and 26b in separate areas of substrate 1. In this case it is furthermore possible to provide a separate line and a separate electrode terminal for second mass elements 26a and 26b or the second capacitance. For practical purposes it may be advantageous, however, to actuate both self-supporting electrodes via a shared line and a shared terminal.

Since second mass elements 26a and 26b have more mass than first mass elements 25a and 25b, first mass elements 25a and 25b are more heavily deflected than second mass elements 26a and 26b in an acceleration of acceleration sensor 20 in the direction of a surface normal of the main surface of substrate 1. This means that the distance of the electrodes in the first capacitance changes to a greater extent than the distance of the electrodes in the second capacitance. This in turn results in a difference in the capacitance changes in the first and the second capacitance, which is able to be measured at electrode terminals 28, 29 and 30 via an applied voltage. A value of the acceleration is able to be inferred in this way.

What is claimed is:

1. A micromechanical component, comprising:
   a substrate having a main surface;
   a first multitude of trench structures positioned within the substrate and separating a first mass element and a second mass element of the substrate from a first web element of the substrate, in such a way that the first and second mass elements enclose the first web element along an extension direction of the main surface and are disposed so as to allow movement relative to the substrate in a direction of a surface normal of the main surface;
   a first electrode layer applied on the main surface of the substrate and forming a first electrode on the first web element between the first and second mass elements; and
   a second electrode layer applied on the first and second mass elements and forming a self-supporting second electrode above the first electrode in the region of the first web element, wherein the first and second electrodes form a first capacitance.

2. The micromechanical component as recited in claim 1, wherein the micromechanical component is an acceleration sensor, and wherein the first electrode layer is applied on the first and second mass elements, and wherein the acceleration sensor includes a dielectric layer applied between the first electrode layer and the second electrode layer on the first and second mass elements.

3. The micromechanical component as recited in claim 1, further comprising:
   a second multitude of trench structures positioned within the substrate and separating a third mass element and a fourth mass element of the substrate from a second web element of the substrate, in such a way that the third and fourth mass elements enclose the second web element along an extension direction of the main surface and are disposed so as to allow movement relative to the substrate in the direction of a surface normal of the main surface;
   wherein the first electrode layer forms a third electrode on the second web element between the third and fourth mass elements, and wherein the second electrode layer is applied on the third and fourth mass elements and forms a self-supporting fourth electrode above the third electrode in the region of the second web element, and wherein the third and fourth electrodes form a second capacitance.

4. The micromechanical component as recited in claim 3, wherein the mass of the third and fourth mass elements is greater than the mass of the first and second mass elements.

5. The micromechanical component as recited in claim 4, wherein an acceleration along the surface normal of the main surface is measurable based on a difference of capacitance changes of the first and second capacitances.

* * * * *